United States Patent
Kim et al.

(10) Patent No.: US 10,605,870 B2
(45) Date of Patent: *Mar. 31, 2020

(54) METHOD FOR PREDICTING BATTERY CHARGE LIMIT, AND METHOD AND APPARATUS FOR RAPIDLY CHARGING BATTERY USING SAME

(71) Applicant: LG CHEM, LTD., Seoul (KR)

(72) Inventors: Hyo-Mi Kim, Daejeon (KR); Hyeok-Moo Lee, Daejeon (KR); Song-Taek Oh, Daejeon (KR); Sol-Nip Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 380 days.

This patent is subject to a terminal disclaimer.

(21) Appl. No.: 15/574,356

(22) PCT Filed: Aug. 4, 2016

(86) PCT No.: PCT/KR2016/008614
§ 371 (c)(1),
(2) Date: Nov. 15, 2017

(87) PCT Pub. No.: WO2017/030309
PCT Pub. Date: Feb. 23, 2017

(65) Prior Publication Data
US 2018/0292461 A1    Oct. 11, 2018

(30) Foreign Application Priority Data
Aug. 18, 2015   (KR) .................. 10-2015-0116247

(51) Int. Cl.
*G01R 31/388*    (2019.01)
*H01M 10/44*    (2006.01)
(Continued)

(52) U.S. Cl.
CPC ........... *G01R 31/388* (2019.01); *G01R 31/36* (2013.01); *H01M 10/0525* (2013.01);
(Continued)

(58) Field of Classification Search
CPC .............................. G01R 31/36; G01R 31/388
See application file for complete search history.

(56) References Cited

U.S. PATENT DOCUMENTS 6,459,243 B1    10/2002  Cheiky et al.
2012/0299552 A1  11/2012  Machida
(Continued)

FOREIGN PATENT DOCUMENTS

JP    2013-89363 A       5/2013
KR    10-2004-0066085 A  7/2004
(Continued)

OTHER PUBLICATIONS

International Search Report for PCT/KR2016/008614 (PCT/ISA/210) dated Nov. 21, 2016.
(Continued)

*Primary Examiner* — David V Henze-Gongola
(74) *Attorney, Agent, or Firm* — Birch, Stewart, Kolasch & Birch, LLP (57) ABSTRACT

Provided are a method of predicting a battery charge limit not to cause lithium (Li)-plating, and a battery charging method and apparatus capable of quickly charging a battery based on the battery charge limit. A battery charge limit prediction method according to the present disclosure includes (a) fabricating a three-electrode cell including a unit cell and a reference electrode, (b) measuring a negative electrode potential (CCV) based on a state of charge (SOC) while charging the three-electrode cell, and (c) determining a point at which the negative electrode potential is not dropped but starts to be constant, as a lithium (Li)-plating
(Continued)

occurrence point, and setting the Li-plating occurrence point as a charge limit.

10 Claims, 5 Drawing Sheets

(51) Int. Cl.
    *G01R 31/36*     (2020.01)
    *H01M 10/0525*     (2010.01)
    *H02J 7/00*     (2006.01)
    *H01M 10/42*     (2006.01)
    *H01M 10/48*     (2006.01)
    *H02J 7/04*     (2006.01)

(52) U.S. Cl.
    CPC ......... *H01M 10/425* (2013.01); *H01M 10/44* (2013.01); *H01M 10/48* (2013.01); *H02J 7/00* (2013.01); *H02J 7/045* (2013.01); *H01M 2010/4271* (2013.01); *Y02T 10/7011* (2013.01)

(56) References Cited

U.S. PATENT DOCUMENTS

| | | | |
|---|---|---|---|
| 2013/0069584 A1* | 3/2013 | Nagakura | H02J 7/0086 320/107 |
| 2013/0317771 A1 | 11/2013 | Laskowsky et al. | |
| 2014/0023888 A1 | 1/2014 | Fulop et al. | |
| 2014/0253023 A1 | 9/2014 | Paryani et al. | |
| 2014/0375279 A1 | 12/2014 | Nishino et al. | |
| 2015/0022157 A1 | 1/2015 | Takahashi | |
| 2015/0100260 A1 | 4/2015 | Joe et al. | |
| 2015/0369869 A1 | 12/2015 | Tsuzuku et al. | |
| 2016/0254687 A1* | 9/2016 | Tanaka | B60L 50/51 320/112 |
| 2018/0226695 A1* | 8/2018 | Miyaki | H01M 4/505 |

FOREIGN PATENT DOCUMENTS

| | | |
|---|---|---|
| KR | 10-2013-0139760 A | 12/2013 |
| WO | WO 2014/132491 A1 | 9/2014 |

OTHER PUBLICATIONS

Liu, Y.H., et al, "Search for an Optimal Rapid-Charging Pattern for Li-Ion Batteries Using the Taguchi Approach" IEEE Transactions on Industrial Electronics, Nov. 10, 2010, vol. 57, No. 12, pp. 3963-3971.

* cited by examiner

METHOD FOR PREDICTING BATTERY CHARGE LIMIT, AND METHOD AND APPARATUS FOR RAPIDLY CHARGING BATTERY USING SAME

TECHNICAL FIELD

The present disclosure relates to a battery charging method and apparatus and, more particularly, to a quick battery charging method and apparatus using stepwise charging current reduction to increase the lifetime of a battery and to quickly charge the battery. The present application claims priority to Korean Patent Application No. 10-2015-0116247 filed on Aug. 18, 2015 in the Republic of Korea, the disclosure of which is incorporated herein by reference.

BACKGROUND ART

Currently, since demands for portable electronic products such as laptop computers and mobile phones are rapidly increased and demands for electric carts, electric wheelchairs, electric bikes, etc. are also increased, research is being actively conducted on repeatedly rechargeable high-performance batteries. In addition, due to gradual exhaustion of carbon energy and increased attention to the environment, global demands for hybrid electric vehicles (HEVs) and electric vehicles (EVs) are increased. As such, more attention and research are focused on a battery which is a major part of a HEV or EV, and development of a quick charging technology capable of charging the battery at a high speed is urgently required. In particular, quick charging is a very significant performance factor for an EV having no extra energy source.

A process for charging the battery includes supplying a current to the battery to accumulate charges and energy therein, and requires careful control. In general, an excessive charging rate (C-rate) or charging voltage can permanently deteriorate the performance of the battery and ultimately cause a complete failure or a sudden failure such as explosion or leakage of a corrosive chemical material.

A conventional battery charging method includes a constant current (CC) charging method for charging a battery with a constant current from beginning to end, a constant voltage (CV) charging method for charging a battery with a constant voltage from beginning to end, and a constant current-constant voltage (CC-CV) charging method for charging a battery with a constant current at the beginning and with a constant voltage later.

In the CC charging method, at the beginning, a voltage difference is large and thus a high current flows. Although a high charging current is desirable in terms of quick charging, if a battery is continuously charged with a high current, charging efficiency may be reduced and the lifetime of the battery may be influenced. Furthermore, in the CC charging method, since the current flowing at the beginning of charging continuously flows through the battery after charging is completed, lithium (Li)-plating occurs due to characteristics of Li ions and thus a safety problem of losing an overcharge control function is caused. Therefore, the battery should be detached from a charger immediately after the battery is fully charged. In the CV charging method, when a battery is fully charged, a terminal voltage is greatly changed due to a variation in temperature and heating of the battery and thus a constant voltage value may not be easily set in advance. Furthermore, since the battery is generally charged with about 15.5 to 16V for 20 to 24 hours, a charging time is long.

The most commonly used method is the CC-CV charging method in which a battery is charged with a constant current when the battery is discharged a lot, and then is charged with a constant voltage when the battery is almost fully charged, thereby preventing overcharge. When "C" denotes a battery capacity in a charge unit (often denoted by Q) A·h, a current in amperes is selected as a fraction (or multiplier) of C. A battery is generally charged at up to 1C. For example, a Li battery having a capacity of 700 mAh is fully charged after about 1 hour and 30 minutes. However, in this charging method, the battery should be charged in a condition suitable for the charging capacity of a charger, at a well-ventilated place, and at a room temperature of about 25° C.

The CC charging method is the most advantageous for quick charging. However, when the battery is quickly charged at a high charging current density, Li is not intercalated into but is deposited on a negative electrode and thus Li-plating occurs. Furthermore, the deposited Li may cause problems such as side reaction with an electrolyte and a change in kinetic balance of the battery, and may ultimately cause deterioration of the battery. Therefore, a technology capable of quickly charging a battery without causing Li-plating is required.

DISCLOSURE

Technical Problem

The present disclosure is designed to solve the problems of the related art, and therefore the present disclosure is directed to providing a method of predicting a battery charge limit not to cause lithium (Li)-plating.

The present disclosure is also directed to providing a battery charging method and apparatus capable of quickly charging a battery based on the battery charge limit.

Technical Solution

In one aspect of the present disclosure, there is provided a battery charge limit prediction method including (a) fabricating a three-electrode cell including a unit cell and a reference electrode, (b) measuring a negative electrode potential (CCV) based on a state of charge (SOC) while charging the three-electrode cell, and (c) determining a point at which the negative electrode potential is not dropped but starts to be constant, as a lithium (Li)-plating occurrence point, and setting the Li-plating occurrence point as a charge limit.

In particular, a point at which a negative electrode potential gradient is changed in a graph of the negative electrode potential based on the SOC may be set as the charge limit.

Charge limits at different charging rates may be obtained by repeatedly performing the operations (b) and (c) at the charging rates and a charging protocol may be obtained by combining the charge limits.

In another aspect of the present disclosure, there is also provided a battery charging method for charging a battery by setting a point at which a negative electrode potential of a battery is not dropped but starts to be constant at an initial charging rate higher than 1C, as a lithium (Li)-plating occurrence point, setting the Li-plating occurrence point as a charge limit, and reducing the charging rate in a stepwise manner when the charge limit is reached.

In particular, a point at which the negative electrode potential is not dropped but starts to be constant and at which a negative electrode potential gradient is changed may be set as the charge limit. The initial charging rate may be 1.5C to 5C.

The charging rate may be reduced to a subsequent charging rate when the charge limit is reached during charging, and charging may be performed until a state of charge (SOC) of the battery is 80%.

In another aspect of the present disclosure, there is also provided a battery charging method including acquiring data by measuring a negative electrode potential based on a state of charge (SOC) at different charging rates in a test of a three-electrode cell including a unit cell and a reference electrode, obtaining a protocol for changing a charging rate in a stepwise manner by determining a point at which the negative electrode potential is not dropped but starts to be constant, as a lithium (Li)-plating occurrence point, and setting the Li-plating occurrence point as a charge limit, and charging a battery based on the protocol.

In this case, a point at which the negative electrode potential is not dropped but starts to be constant and at which a negative electrode potential gradient is changed may be set as the charge limit.

The charging rates used to acquire the data may range from 0.25C to 5C. The protocol may include an initial charging rate higher than 1C.

The protocol may include an initial charging rate of 1.5C to 5C.

The protocol may include charging rates reduced in a stepwise manner, and charging voltage information after charging at each charging rate.

In another aspect of the present disclosure, there is also provided a battery charging apparatus including a power supply unit configured to output a charging voltage input from a commercial power source, and a battery charging unit configured to charge a battery by outputting the charging voltage input from the power supply unit, as a charging current to the battery, and to control the charging current output to the battery, to be changed in a stepwise manner by changing the charging current when a charging voltage of the battery reaches a preset level, wherein the battery charging unit charges the battery by adjusting the charging current in a stepwise manner based on a protocol for changing a charging rate in a stepwise manner by determining a point at which a negative electrode potential of the battery is not dropped but starts to be constant, as a lithium (Li)-plating occurrence point, and setting the Li-plating occurrence point as a charge limit.

Advantageous Effects

The present disclosure proposes a protocol for changing a charging rate in a stepwise manner by determining a point at which a negative electrode potential is not dropped any more but starts to be constant during constant current (CC) charging and at which the speed of dropping the negative electrode potential is changed, as a lithium (Li)-plating occurrence point, setting the Li-plating occurrence point as a charge limit, and changing the charging rate to a subsequent charging rate when the charge limit is reached. If a battery is charged by adjusting a charging current in a stepwise manner based on the protocol, the battery may be quickly charged by preventing occurrence of Li-plating on a negative electrode.

As such, according to the present disclosure, occurrence of Li-plating on a negative electrode of a battery may be prevented by determining a point at which a negative electrode potential is not dropped but starts to be constant, as a Li-plating occurrence point, and setting the Li-plating occurrence point as a charge limit, and thus the lifetime of the battery may be increased and the battery may be quickly charged.

Since the battery is charged without causing Li-plating, problems such as side reaction between deposited Li and an electrolyte and a change in kinetic balance of the battery may be prevented and deterioration of the battery may also be prevented. Since the battery is charged at a high charging rate as long as Li-plating is not caused, the battery may be quickly charged.

The point at which the negative electrode potential is not dropped but starts to be constant may differ per cell. The present disclosure does not propose a charge limit equally applied to all cells by ignoring characteristics of each cell, but proposes a charging method optimized for each cell by accurately checking a condition in which Li-plating occurs during charging, based on a test of a three-electrode cell.

DESCRIPTION OF DRAWINGS

The accompanying drawings illustrate a preferred embodiment of the present disclosure and together with the foregoing disclosure, serve to provide further understanding of the technical concept of the present disclosure, and thus, the present disclosure is not construed as being limited to the drawing.

BEST MODE

Hereinafter, the present disclosure will be described in detail by explaining embodiments of the disclosure with reference to the attached drawings. The disclosure may, however, be embodied in many different forms and should not be construed as being limited to the embodiments set forth herein, rather, these embodiments are provided so that this disclosure will be thorough and complete, and will fully convey the concept of the disclosure to one of ordinary skill in the art.

The biggest problem of constant current (CC)-type quick charging is cell deterioration due to lithium (Li)-plating on the surface of a negative electrode. Li-plating occurs seriously when a charging current density (a charging rate or a charging current) is high and when the temperature is low. If the charging current density is lowered to prevent Li-plating, a desired charging rate cannot be achieved. The present disclosure may provide a technology capable of shortening a charging time without causing Li-plating in a battery.

Figure 1:
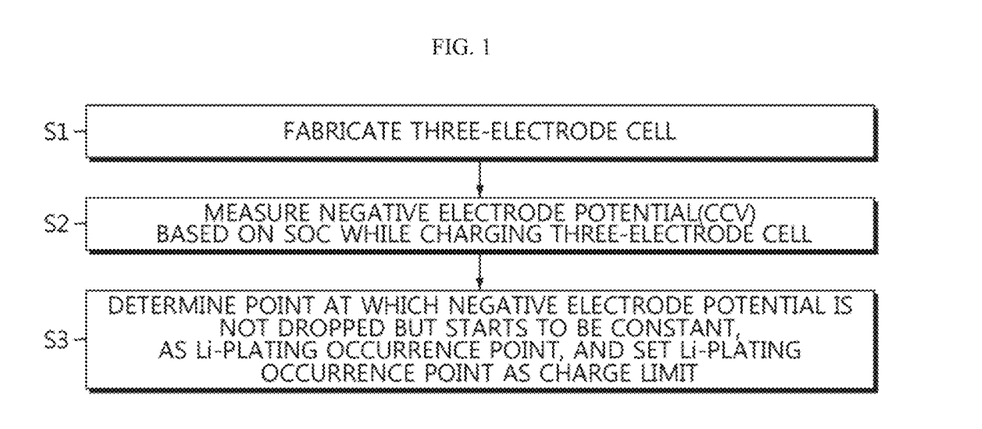
FIG. 1 is a flowchart of a battery charge limit prediction method according to the present disclosure.

FIG. 1 is a flowchart of a battery charge limit prediction method according to the present disclosure.

Referring to FIG. 1, initially, a three-electrode cell is fabricated (s1).

Figure 2:
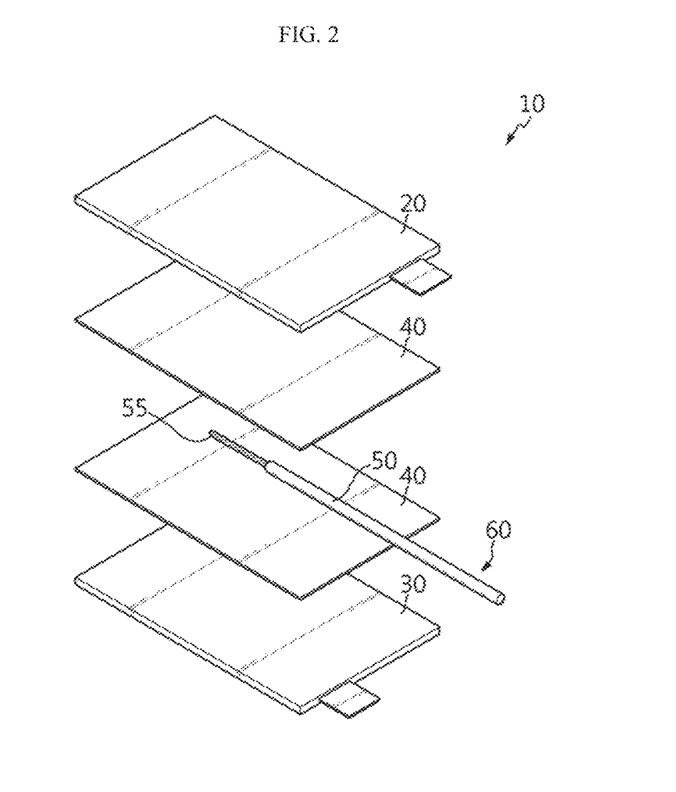
FIG. 2 shows the structure of a pouch-type three-electrode cell used for a test of the present disclosure.

The three-electrode cell is used for research on a secondary battery to check operations of a negative electrode and a positive electrode, and includes a unit cell and a reference electrode. The three-electrode cell may employ a generally well-known structure. FIG. 2 shows the structure of a pouch-type three-electrode cell 10 used for a test of the present disclosure.

The three-electrode cell 10 is fabricated by disposing separators 40 between a negative electrode 20 and a positive electrode 30, and inserting a reference electrode 60 between the separators 40. The reference electrode 60 may have a plate shape like the negative or positive electrode 20 or 30, or have a wire shape as illustrated in FIG. 2 to more accurately detect the flow of current. For example, FIG. 2 illustrates the wire-type reference electrode 60 including copper wire 55 coated with an insulating layer 50. Since the reference electrode 60 serving as a third electrode irrespective of polarization is provided in a battery and polarization of each of the other electrodes 20 and 30 is in-situ analyzable by measuring a potential difference therefrom, the three-electrode cell 10 is a useful analysis tool.

The negative electrode 20, the positive electrode 30, and an electrolyte (not shown) configure a unit cell. For example, the negative electrode 20 includes a graphite-based negative electrode active material such as graphite, a conductive material having 1 to 5 parts by weight with respect to 100 parts by weight of the negative electrode active material, and a polymer binder having 1 to 5 parts by weight. The positive electrode 30 includes a positive electrode active material such as $LiCoO_2$, a conductive material having 1 to 5 parts by weight with respect to 100 parts by weight of the positive electrode active material, and a polymer binder having 1 to 5 parts by weight. The electrolyte has a general composition. The unit cell and the reference electrode 60 are accommodated in a pouch.

Figure 3:
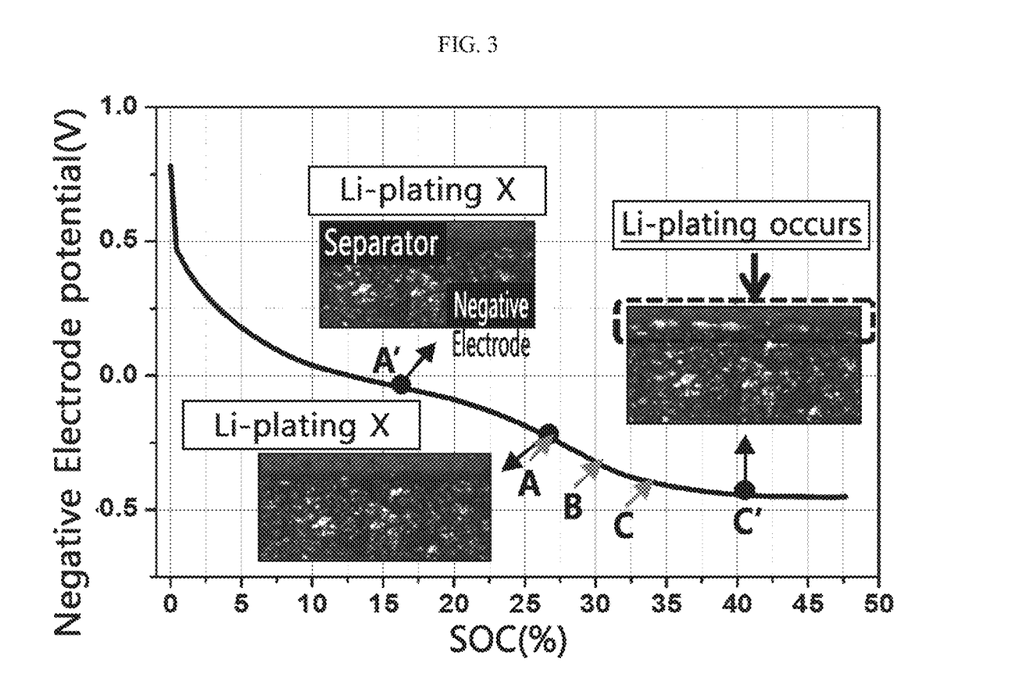
FIG. 3 is a negative electrode potential graph based on a state of charge (SOC) according to the test of the present disclosure, and also shows a result of in-situ visualization analysis.

Then, charging characteristics based on a negative electrode potential (CCV) are observed while charging the three-electrode cell fabricated in step s1 (s2). A result of the observation may be described using, for example, a negative electrode potential graph based on a state of charge (SOC) as shown in FIG. 3. FIG. 3 shows a result obtained when the three-electrode cell 10 illustrated in FIG. 2 is charged at a charging rate 3C.

In general, during charging, since Li is intercalated into the negative electrode active material, a stage is lowered and a negative electrode potential is dropped. In this case, if a charging current density is increased, although the stage is not observed well, the negative electrode potential is continuously dropped due to intercalation of Li and an increase in resistance. The result of FIG. 3 shows that the negative electrode potential is gradually dropped from about 0.75V and is dropped to below 0V and then to about −0.45V as charging is continued.

However, a reaction in which Li is intercalated into the negative electrode active material and a reaction in which Li-plating occurs competitively occur during charging. The present inventors have found through repeated tests that, when Li-plating occurs during charging, Li cannot be intercalated into the negative electrode active material and thus the negative electrode potential is not dropped but is constantly maintained thereafter. As such, the present disclosure proposes to determine a point at which the negative electrode potential is not dropped but starts to be constant during charging, as a Li-plating occurrence point.

In FIG. 3, a region in which the negative electrode potential has an almost flat plateau is observed after a certain point, e.g., point B. In this case, it is determined that Li ions not intercalated into the negative electrode active material are plated on an electrode surface (between a negative electrode and a separator). As such, in the graph of FIG. 3, point B is set as a charge limit.

To check variations in the negative electrode potential during actual charging and check electrode states during charging, in-situ visualization analysis is performed while charging the three-electrode cell 10 illustrated in FIG. 2. For the in-situ visualization analysis, the three-electrode cell 10 is located on a surface observation block cell of an electrochemical reaction visualizing confocal system, and charge/discharge profiles during charging/discharging and negative electrode intercalation are observed. ECCS B310 is used for this test. The negative electrode potential-SOC graph of FIG. 3 also shows a result of the in-situ visualization analysis.

In general, a graphite-based negative electrode passes through a few stages during charging as described above and ultimately reaches an SOC of 100% in which Li ions are fully inserted between layers. 1f in-situ visualization analysis is performed in this case, the color of an electrode active material is changed to gold. A distribution of reactions may be analyzed based on color changes from gray to blue, red, and gold during charging.

In FIG. 3, even in a period in which the negative electrode potential is being dropped, no Li-plating is observed between the separator and the negative electrode in the in-situ visualization analysis result at point A' at which the negative electrode potential is 0V. It is also shown that Li is inserted into the negative electrode and thus Li-plating is not observed on the surface of the negative electrode at point A at which the negative electrode potential is less than 0V and which is close to the charge limit according to the present disclosure.

A region in which the negative electrode potential has an almost flat plateau is observed after points B and C. As shown in the in-situ visualization analysis result of point C' at which a totally flat plateau starts, Li ions not intercalated into the active material are deposited and plated as Li metal on the electrode surface (between the negative electrode and the separator).

Figure 4:
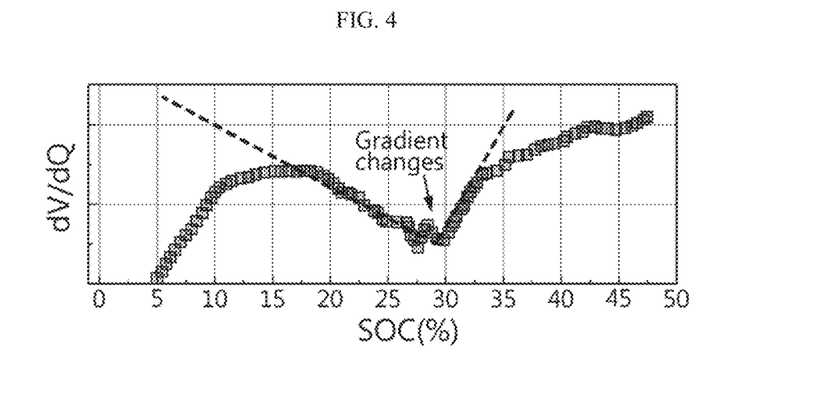
FIG. 4 is a dV/dQ graph obtained based on FIG. 3.

To more accurately find the Li-plating occurrence point, a dV/dQ graph is obtained as shown in FIG. 4 and a point at which a negative electrode potential gradient is changed, i.e., a point at which the speed of dropping the negative electrode potential is changed (an inflection point), is set as a charge limit at which Li-plating occurs.

As such, a point at which the negative electrode potential is not dropped but starts to be constant and at which the speed of dropping the negative electrode potential is changed (a point at which a negative electrode potential gradient is changed (an inflection point)) in the result of step s2, i.e., the negative electrode potential graph based on the SOC, is set as the Li-plating occurrence point, i.e., the charge limit, in the present disclosure (s3).

If steps s2 and s3 are performed once again at another charging rate, a charge limit at the charging rate may be obtained. As such, if charge limits are obtained by repeatedly performing steps s2 and s3 at different charging rates until a charging termination point, e.g., until an SOC of 80% is satisfied, a charging protocol of the cell may be obtained by combining the obtained data. A charging method using the charging protocol is a quick charging method according to the present disclosure.

As such, in the charge limit prediction method according to the present disclosure, a three-electrode cell is fabricated, charging characteristics based on a negative electrode potential are observed, and thus a charge limit at which Li-plating does not occur when charging is performed at each charging current is calculated. As such, the three-electrode cell may be charged by reducing the charging current in a stepwise manner, for example, by determining a point at which the negative electrode potential is not dropped but starts to be constant, as the charge limit and charging the three-electrode cell at a subsequent charging rate when the charge limit is reached. Consequently, a multi-step charging technology capable of shortening a charging time without causing Li-plating may be provided.

Compared to a case in which, for example, "the negative electrode potential should be equal to or greater than 0V (Li+/Li vs. 0V)", the above method continues charging until the negative electrode potential is dropped to below 0V. Referring to FIG. 3, in the case of Li+/Li vs. 0V, since the negative electrode potential is 0V at an SOC of about 15%, a small SOC is achievable at the same charging current density. However, according to the present disclosure, since an SOC of up to 30% may be achieved at the same charging current density, the charge limit prediction method of the present disclosure is more effective in terms of quick charging which requires a large amount of charging within a short time.

A test has been performed to show validity of the above-described charge limit prediction method. The pouch-type three-electrode cell 10 (see FIG. 2) is fabricated and a result of testing cycles to point B (see FIG. 3) at which Li-plating occurs, and to points A and C before and after point B is shown in FIG. 5.

The lifetime of a battery indicates how long the battery is usable, and is expressed using cycles which are also called cycle characteristics. That is, the lifetime of the battery indicates how many times the battery is rechargeable. In terms of electrical energy, a cycle refers to a case in which the battery is charged once and used to a fully discharged state, and the number of cycles is referred to as the lifetime.

Figure 5:
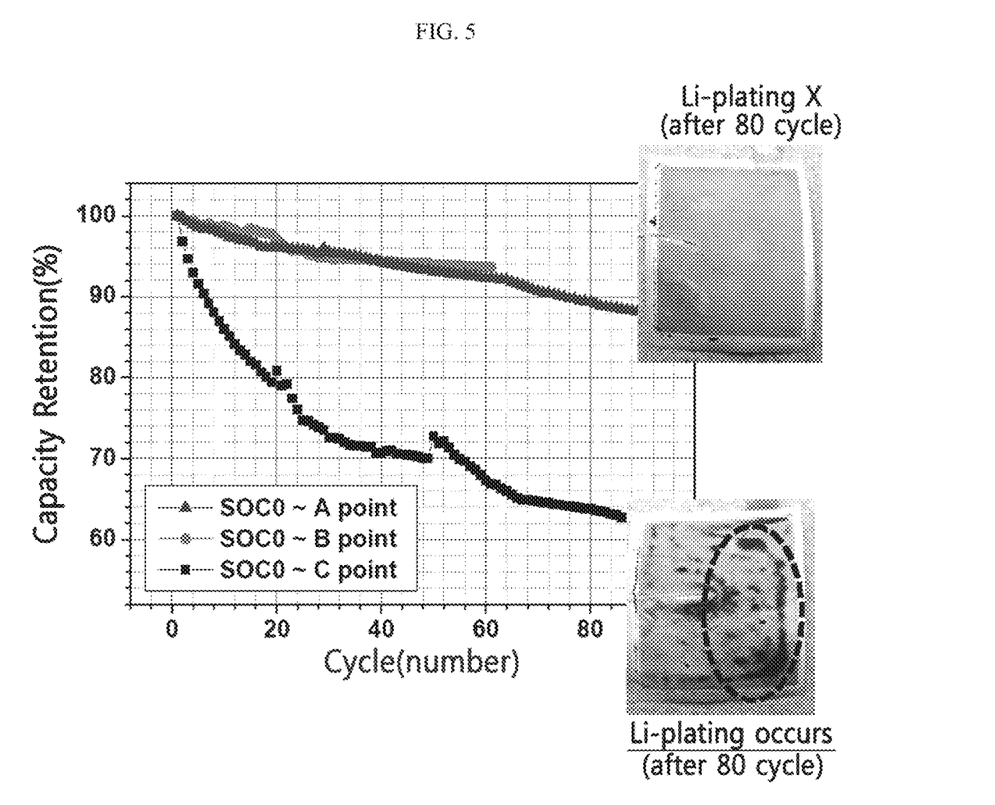
FIG. 5 is a graph for comparing lifetime cycles to show validity of the charge limit prediction method according to the present disclosure.

FIG. 5 is a graph showing variations in capacity based on the number of cycles. For a long lifetime, the capacity of a battery should not be greatly reduced but needs to be constantly retained after a large number of charge/discharge cycles.

As shown in FIG. 5, when a cell is tested 80 cycles until point C and then is disassembled, much Li-plating is observed. On the contrary, when a cell is tested 80 cycles until point A or B, Li-plating is not observed. In addition, as shown in the lifetime test result, the capacity of the cell tested until point C is reduced to 80% after 20 cycles and then reduced to below 64% after 80 cycles. As such, Li-plating occurring during charging/discharging (when charging is performed until point C) can deteriorate cell lifetime characteristics. As proposed by the present disclosure, when the cell is tested 80 cycles by setting point B as a charge limit, the capacity of the cell may be retained and deterioration of the cell may be prevented, thereby extending the lifetime of the cell.

A battery charging method according to the present disclosure based on the above test result about charge limit prediction is as described below.

Figure 6:
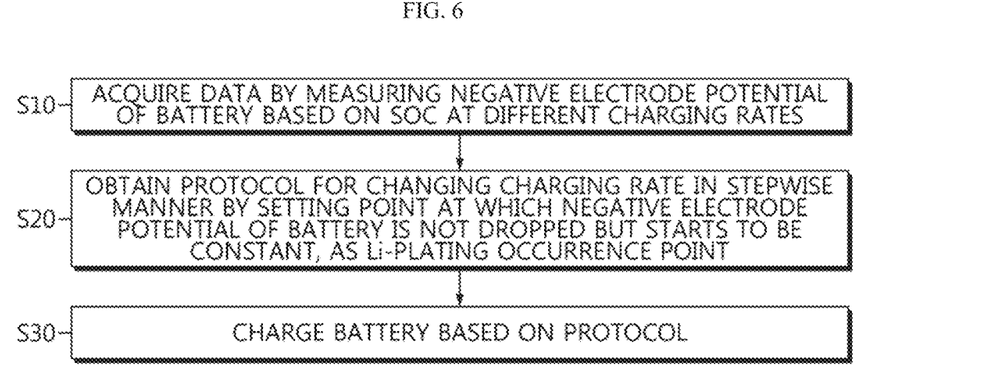
FIG. 6 is a flowchart of a battery charging method according to the present disclosure.

FIG. 6 is a flowchart of a battery charging method according to the present disclosure.

Referring to FIG. 6, data is acquired by measuring a negative electrode potential of a battery based on an SOC at different charging rates (s10).

Step s10 may be performed by testing a three-electrode cell including a unit cell and a reference electrode based on the above-described battery charge limit prediction method according to the present disclosure.

When "C" denotes a battery capacity in a charge unit (often denoted by Q) A·h, a current in amperes is selected as a fraction (or multiplier) of C. For example, a charging rate 1C refers to a charge/discharge speed at which a fully charged capacity of a battery is consumed or filled within an hour, or refers to a current density at that time. As functions of electronic devices are currently diversified, a required amount of current used by the devices within a certain time is greatly increased. As such, a battery used as an energy source thereof requires much higher performance. Mobile phones mostly required a charging rate and a discharging rate of C/2 in the past, but can require a charging rate and a discharging rate of 1C in the future due to enhanced functions thereof. Currently, batteries for laptop computers, electric vehicles (EVs), plug-in hybrid electric vehicles (PHEVs), etc. require an equivalent charging rate and a much higher discharging rate.

A charging rate higher than 1C is preferable in terms of quick charging. However, if charging is continued at a high current, the battery can be excessively heated and each electrode can cause an overvoltage state due to the resistance of the battery. Accordingly, the charging rate should be determined in consideration of the type and characteristics of the battery.

A charging rate range used to acquire the data may vary based on the type and characteristics of the battery. For example, the data of a battery for an EV may be acquired within a charging rate range from 0.25C to 1.5C by setting an initial charging rate to be 1.5C. As another example, the data of a battery for a PHEV may be acquired within a charging rate range from 0.25C to 3C by setting an initial charging rate to be 3C. The initial charging rate and the charging rate range may be restricted not only by the type of the battery but also by the maximum current of a motor actually used in a vehicle.

As described above, in consideration of the characteristics of the battery, a battery for an EV may set an initial charging rate thereof to be 1.5C, and a battery for a PHEV may set an initial charging rate thereof to be 3C. For battery specifications which require higher charging and discharging rates, the initial charging rate may be further increased to, for example, 5C. Therefore, the initial charging rate may be 1.5C to 5C, and the charging rate range used to acquire the data according to the present disclosure may be from 0.25C to 5C.

As described above, more attention and research are focused on a battery which is a major part of a HEV or EV, and development of a quick charging technology capable of charging the battery at a high speed is urgently required. The vehicle market increasingly requires a short charging time and thus a higher initial charging rate is necessary. Although an increase in the initial charging rate is advantageous in terms of quick charging, due to the above-described problems, each electrode can cause an overvoltage state due to the resistance of the battery at an excessively high charging rate. Furthermore, at the excessively high charging rate, since a charge limit (e.g., below 0V of a negative electrode potential in the present disclosure) is reached immediately after charging is started, a total charging time may not be greatly reduced. Therefore, the resistance characteristics of the battery should be improved to increase the initial charging rate. The present disclosure may increase the initial charging rate to 5C for batteries having improved resistance characteristics compared to conventional batteries.

Figure 7:
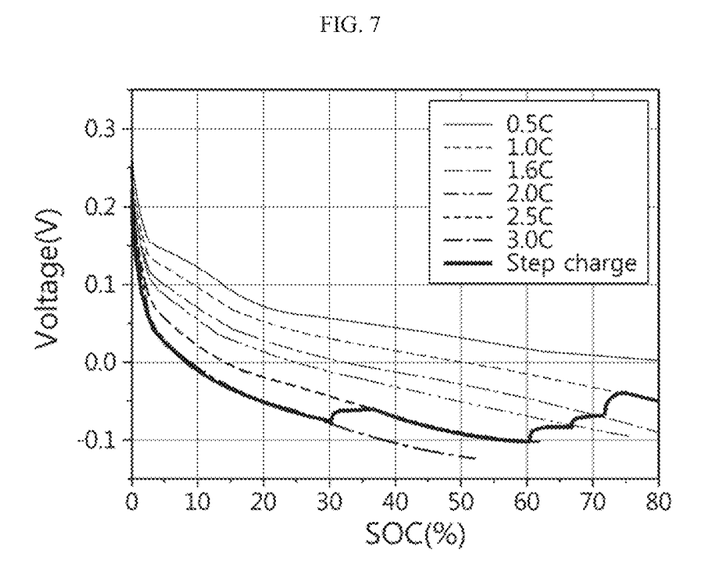
FIG. 7 shows negative electrode potentials based on charging rates, and a negative electrode potential obtained during protocol charging based on the negative electrode potentials.

FIG. 7 shows negative electrode potentials based on charging rates. As shown in FIG. 7, a graph may be obtained by measuring the negative electrode potential based on the SOC while changing the charging rate from 3C to 0.5C.

After that, a protocol for changing the charging rate in a stepwise manner by setting a point at which the negative electrode potential of the battery is not dropped but starts to be constant, as a Li-plating occurrence point based on the acquired data is obtained (s20). If the point at which the negative electrode potential is not dropped but starts to be constant is set as the Li-plating occurrence point, Li-plating is not caused on the negative electrode.

For example, a protocol indicated as "step charge" in FIG. 7 may be obtained to set the point at which the negative electrode potential is not dropped but starts to be constant, as the Li-plating occurrence point. When charging is performed at an initial charging rate of 3C, Li-plating occurs at a point corresponding to an SOC of 30%. Thus, the charging rate is changed to a subsequent charging rate of 2.5C. When charging is performed at the changed charging rate, Li-plating occurs at a point corresponding to an SOC of 37%. Thus, the charging rate is changed to a subsequent charging rate of 2.0C. When charging is performed at the changed charging rate. Li-plating occurs at a point corresponding to an SOC of 61%. Thus, the charging rate is changed to a subsequent charging rate of 1.6C. When charging is performed at the changed charging rate, Li-plating occurs at a point corresponding to an SOC of 67%. Thus, the charging rate is changed to a subsequent charging rate of 1.0C. When charging is performed at the changed charging rate, if a point corresponding to an SOC of 80%, which is determined as a charging termination condition, is reached, charging is terminated.

The protocol may be obtained as described above. The negative electrode potential graph based on the SOC may vary based on the type of the battery, but the above-described method of obtaining the protocol may be similarly applied.

Although the charging rate is reduced from 3C to 1.0C according to the current embodiment, the initial charging rate range and the charging rate range used to obtain the data may be variously changed as described above, and the charging rate may be reduced by an arbitrary value other than 0.5C, 0.6C, or 0.4C described above according to the current embodiment.

Figure 8:
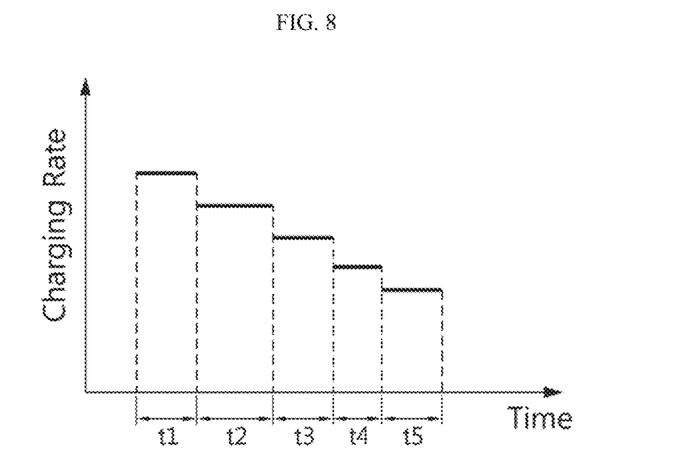
FIG. 8 is a graph showing the charging rate (charging current) based on time in a case when the battery is charged using the method according to the present disclosure.

FIG. 8 is a graph showing the charging rate (charging current) based on time in a case when the battery is charged using the method according to the present disclosure, and shows the protocol of FIG. 7 as the charging rate based on time.

The charging current of a charger for charging the battery is reduced in a stepwise manner from the initial charging rate of 3C to the ultimate charging rate of 1.0C as time passes. Durations t1 to t5 of the charging rates may be different because the point at which the negative electrode potential is not dropped but starts to be constant is set as the Li-plating occurrence point as described above. As such, according to the present disclosure, the negative electrode potential based on the charging rate is measured and thus a charge limit at which Li-plating does not occur when charging is performed at each current is calculated.

Thereafter, the battery is charged based on the protocol (s30). The protocol may include the charging rates which are reduced in a stepwise manner, and charging voltage information after charging is terminated at each charging rate. According to the present disclosure, charging may be performed by applying charging currents optimized based on the protocol.

The charging protocol may be implemented using a battery charging apparatus according to the present disclosure. The battery charging apparatus includes a power supply unit configured to output a charging voltage input from a commercial power source, and a battery charging unit configured to charge a battery by outputting the charging voltage input from the power supply unit, as a charging current to the battery, and to control the charging current output to the battery, to be changed in a stepwise manner by changing the charging current when a charging voltage of the battery reaches a preset level. The battery charging unit charges the battery by adjusting the charging current in a stepwise manner based on a protocol for changing a charging rate in a stepwise manner by setting a point at which a negative electrode potential of the battery is not dropped but starts to be constant, as a Li-plating occurrence point.

As such, logic of the protocol of the charging method according to the present disclosure may be integrated with the battery charging apparatus and used to charge the battery. The battery charging unit employs a processor for quick charging. According to an embodiment of the present disclosure, the processor may store the logic of the charging protocol in memory, and may measure a voltage, a current, etc. with high accuracy for accurate control and apparatus performance retention.

In addition, according to the present disclosure, since the negative electrode potential is controlled not to pass the Li-plating occurrence point, compared to a general constant current-constant voltage (CC-CV) charging method, Li-plating may not occur on the negative electrode and thus the lifetime of the battery may be increased.

Figure 9:
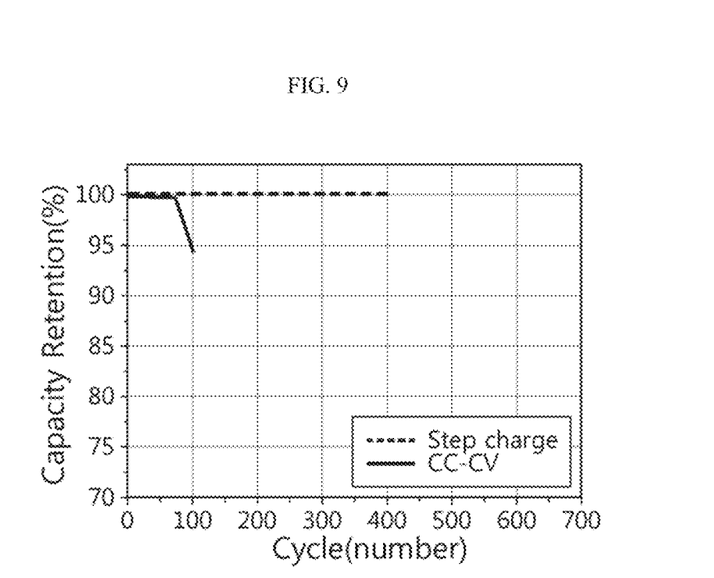
FIG. 9 is a graph for comparing battery lifetimes based on a charging method using stepwise charging current reduction according to the present disclosure, and a conventional constant current-constant voltage (CC-CV) charging method.

FIG. 9 is a graph for comparing battery lifetimes based on a charging method using stepwise charging current reduction according to the present disclosure, and a conventional constant current-constant voltage (CC-CV) charging method.

In the present disclosure and the conventional method, the lifetimes are compared by setting the same charging time and the same discharge condition (e.g., 1C CC). As shown in FIG. 9, a capacity retention rate starts to be reduced after 75 cycles and is reduced to about 95% after 100 cycles according to the conventional CC-CV charging method, but the capacity retention rate is maintained at 100% even after 400 cycles according to the present disclosure (step charge).

The battery lifetime is determined depending on a variety of factors, and structural stability of electrodes and, more particularly, stability of a negative electrode is significant. An ideal negative electrode should have a high reversibility in reaction with Li ions. If ideal reversible reaction occurs, the capacity retention rate is not changed based on cycles. The charging method using stepwise charging current reduction according to the present disclosure has a higher reaction reversibility compared to the conventional method because Li-plating on the negative electrode is prevented. As such, based on the charging method using stepwise charging current reduction according to the present disclosure, deterioration of the battery may be prevented and thus the lifetime of the battery may be increased compared to the conventional method.

In the charging method using stepwise charging current reduction according to the present disclosure, since the battery is quickly charged by using an initial charging rate higher than 1C and the charging rate is reduced in a stepwise manner by setting the point at which the negative electrode potential is not dropped but starts to be constant, as the Li-plating occurrence point, the battery may be quickly charged without Li-plating. Damage of the internal structure of the battery may be prevented, and the lifetime of the battery may be improved.

Compared to a case in which, for example, "the negative electrode potential should be equal to or greater than 0V (Li+/Li vs. 0V)", the charge limit prediction method and the charging method according to the present disclosure continue charging until the negative electrode potential is dropped to below 0V. Since a larger SOC is achievable at the same charging current density compared to the case of Li+/Li vs. 0V, the charge limit prediction method and the charging method according to the present disclosure are very effective in terms of quick charging which requires a large amount of charging within a short time.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A battery charge limit prediction method comprising:
    (a) fabricating a three-electrode cell comprising a unit cell and a reference electrode;
    (b) measuring a negative electrode potential (CCV) based on a state of charge (SOC) while charging the three-electrode cell at a charging rate; and
    (c) determining a point at which the negative electrode potential is not dropped but starts to be constant, as a lithium (Li)-plating occurrence point, and setting the Li-plating occurrence point as a charge limit,
    wherein the point is an inflection point of a negative electrode potential gradient based on the SOC, and
    wherein the charging rate is reduced to a subsequent charging rate when the charge limit is reached during charging.

2. The battery charge limit prediction method of claim 1, wherein charge limits at different charging rates are obtained by repeatedly performing the operations (b) and (c) at the charging rates and a charging protocol is obtained by combining the charge limits.

3. A battery charging method for charging a battery by:
    (a) fabricating a three-electrode cell comprising a unit cell and a reference electrode;
    (b) measuring a negative electrode potential (CCV) based on a state of charge (SOC) while charging the three-electrode cell at a charging rate; and
    (c) setting a point at which a negative electrode potential of a battery is not dropped but starts to be constant at an initial charging rate higher than 1C, as a lithium (Li)-plating occurrence point, setting the Li-plating occurrence point as a charge limit, and reducing the charging rate in a stepwise manner when the charge limit is reached,
    wherein the point is an inflection point of a negative electrode potential gradient based on the SOC.

4. The battery charging method of claim 3, wherein the initial charging rate is 1.5C to 5C.

5. The battery charging method of claim 3, wherein the charging rate is reduced to a subsequent charging rate when the charge limit is reached during charging, and charging is performed until a state of charge (SOC) of the battery is 80%.

6. A battery charging method comprising:
    acquiring data by measuring a negative electrode potential based on a state of charge (SOC) at different charging rates in a test of a three-electrode cell comprising a unit cell and a reference electrode;
    obtaining a protocol for changing a charging rate in a stepwise manner by determining a point at which the negative electrode potential is not dropped but starts to be constant, as a lithium (Li)-plating occurrence point, and setting the Li-plating occurrence point as a charge limit;
    reducing the charging rate in a stepwise manner when the charge limit is reached; and
    charging a battery based on the protocol,
    wherein the point is an inflection point of a negative electrode potential gradient based on the SOC.

7. The battery charging method of claim 6, wherein the charging rates used to acquire the data range from 0.25C to 5C.

8. The battery charging method of claim 6, wherein the protocol comprises an initial charging rate higher than 1C.

9. The battery charging method of claim 6, wherein the protocol comprises an initial charging rate of 1.5C to 5C.

10. The battery charging method of claim 6, wherein the protocol comprises charging voltage information after charging at each charging rate.

* * * * *